United States Patent
Frisella et al.

(10) Patent No.: US 7,205,231 B2
(45) Date of Patent: Apr. 17, 2007

(54) METHOD FOR IN-SITU UNIFORMITY OPTIMIZATION IN A RAPID THERMAL PROCESSING SYSTEM

(75) Inventors: Peter A. Frisella, Peabody, MA (US); Paul Lustiber, Chelmsford, MA (US); James Willis, Salem, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 232 days.

(21) Appl. No.: 10/976,710

(22) Filed: Oct. 29, 2004

(65) Prior Publication Data

US 2006/0094261 A1    May 4, 2006

(51) Int. Cl.
*H01L 21/44* (2006.01)

(52) U.S. Cl. .................. 438/663; 438/54; 438/906; 438/715; 257/E21.082

(58) Field of Classification Search ............. 438/663, 438/715, 960, 905, 88, 54
See application file for complete search history.

(56) References Cited

U.S. PATENT DOCUMENTS

| | | | | |
|---|---|---|---|---|
| 5,820,366 A | * | 10/1998 | Lee | .............. 432/241 |
| 5,900,177 A | * | 5/1999 | Lecouras et al. | .......... 219/497 |
| 6,183,137 B1 | | 2/2001 | Kojima et al. | |
| 6,375,348 B1 | * | 4/2002 | Hebb et al. | .............. 374/9 |
| 6,461,036 B1 | | 10/2002 | Shajii et al. | |
| 6,610,968 B1 | * | 8/2003 | Shajii et al. | .......... 219/497 |
| 6,855,916 B1 | * | 2/2005 | Matthews et al. | ......... 219/390 |
| 2003/0087787 A1 | * | 5/2003 | Man et al. | ............ 510/392 |

OTHER PUBLICATIONS

U.S. Appl. No. 10/732,161, filed Dec. 10, 2003, Matthews et al.

* cited by examiner

*Primary Examiner*—David Nhu
(74) *Attorney, Agent, or Firm*—Eschweiler & Associates, LLC

(57) ABSTRACT

The present invention is directed to a method for thermally processing a substrate in a thermal processing system. The method provides an amount of heat to the substrate and obtains information associated with the substrate when the amount of heat is provided. For example, the substrate is provided at a presoak position within the thermal processing system, wherein the presoak position, and one or more properties associated with the substrate, such as a position and temperature, are measured. An optimal process parameter value to provide an optimal thermal uniformity of the substrate is then determined, based, at least in part, on the information obtained from the substrate. For example, a soak position of the substrate is determined, wherein the determination is based, at least in part, on the one or more measured properties associated with the substrate, and a thermal uniformity associated with a reference data set.

16 Claims, 6 Drawing Sheets

METHOD FOR IN-SITU UNIFORMITY OPTIMIZATION IN A RAPID THERMAL PROCESSING SYSTEM

FIELD OF THE INVENTION

The present invention relates generally to semiconductor processing systems, and more specifically to a method for controlling a thermal uniformity of a substrate during thermal processing.

BACKGROUND OF THE INVENTION

Thermal processing systems have been widely known and used for many years to perform a variety of semiconductor fabrication processes, including annealing, diffusion, oxidation, and chemical vapor deposition. As a result, these processes are well understood, especially with regard to the impact of process variables on the quality and uniformity of resulting products. Thermal processing furnaces typically employ either a horizontal-type furnace or a vertical-type furnace. For some applications, vertical-type furnaces are preferred because they create fewer particles during use, thus decreasing an incidence of contamination and workpiece waste. Furthermore, vertical-type furnaces can be easily automated, and typically require less floor space because of their relatively small footprint.

Conventional furnaces are typically designed to heat semiconductor wafers to desired temperatures either to promote diffusion of implanted dopants to a desired depth, or to perform other conventional processing techniques, such as an application of an oxide layer to a wafer or a deposition of a chemical vapor layer to the wafer. Heating requirements associated with the wafer are generally important and are typically closely monitored, especially when performing processes such as a spike anneal process.

Generally, a spike anneal process rapidly raises the temperature of the substrate from a relatively low temperature to a predetermined peak or target temperature, then cools the wafer as quickly as possible, thus minimizing a thermal budget associated with the wafer. The thermal budget, for example, is generally defined as the length of time wherein the wafer temperature is greater than a given temperature threshold. For example, a typical thermal budget temperature threshold can be approximately 50° C. less than the target temperature.

In order to achieve desirably low thermal budgets for spike anneal processes, hot wall thermal processing technology, for example, has been utilized. Hot wall thermal processing generally comprises moving the wafer upward and then downward in a bell jar furnace, thus exposing the wafer to a temperature gradient within the bell jar. However, controlling the wafer position in order to achieve a consistent spike peak temperature and a minimal thermal budget has typically been a problem.

Various temperature trajectories or profiles have been conventionally defined (both simple and time optimized), wherein full closed loop temperature control has been implemented for spike anneal-type thermal processing, and some success has been achieved. Temperature profiles can be generally reliably defined and utilized, provided that time-temperature curves generally define a non-aggressive spike profile (e.g., thermal budgets of 1.8 and higher), and that an average temperature ramp rate is generally sub-optimal.

In contrast, a Move-Wait-Move technique has also been utilized with some success. With the Move-Wait-Move method, the wafer is moved upward in the bell jar (e.g., moved to a higher temperature environment) under closed-loop position control using a predetermined position profile, rather than a temperature profile. The wafer, for example, moves from a pre-soak position that is associated with a relatively low temperature to the elevated position (e.g., the "Wait" position), wherein the wafer remains at the elevated position until a predetermined trigger temperature is reached. When the trigger temperature is reached, the wafer is moved downward (e.g., moved to a lower temperature environment), again under closed loop position control, following the predetermined position profile. If the trigger point is selected properly, the desired peak spike temperature can be achieved.

The Move-Wait-Move process can produce fairly aggressive thermal budgets with good repeatability for wafers when the trigger temperature has been correctly tuned. The Move-Wait-Move process produces several benefits over full closed loop processing. For example, critical temperature measurements are made while the elevator is stopped, as opposed to moving, such that artifacts produced by dynamic stray light compensation are eliminated. Furthermore, the motion which produces the final spike profile is performed using a simple point to point move, and as such, vibration for given velocity and acceleration limits are generally minimized. Still further, the motion profile, as well as the relationship between presoak height, presoak temperature and spike ramp height (e.g., the "wait" position), appear to be critical in the tuning and repeatability of radial uniformities from wafer to wafer. Consequently, variations in the actual move profile utilized in full closed loop processing appear to deleteriously increase the total range and maximum value of the radial thermal non-uniformity.

However, despite the advantages over full closed loop temperature control, it appears that the conventional Move-Wait-Move process (having a fixed predetermined presoak height, spike ramp height, and trigger temperature) cannot be effectively optimized for use with wafers of varying characteristics, such as wafers of varying emissivity, absorbtivity, or other radiative properties, since there is no dynamic compensation for such variations. Without some form of dynamic compensation for wafer variations, repeatability of wafer radial thermal uniformity is generally compromised. Consequently, in processing wafers having varying intra-wafer characteristics, as well as varying inter-wafer characteristics, control of radial thermal uniformity is quite difficult using conventional techniques.

Therefore, a need exists for a method for automatically varying the spike ramp height threshold used during the "Wait" part of the Move-Wait-Move spike technique, wherein the variation is based on dynamic measurements of wafer temperature. Such a method will improve the repeatability of both wafer-to-wafer thermal uniformity, as well as intra-wafer thermal uniformity, and will also optimize the thermal budget when applied to wafers of varying characteristics.

SUMMARY OF THE INVENTION

The present invention overcomes the limitations of the prior art by utilizing dynamic predictive modeling and establishing a relationship between one or more measured properties of a wafer and a wait, or soak position offering an optimal thermal uniformity. Consequently, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is generally directed to a method for thermally processing a substrate in a thermal processing system, wherein a thermal uniformity across the substrate is generally optimized. The thermal processing method generates a predicted temperature profile using a dynamic predictive model, wherein the predicted temperature profile is based on a predetermined process recipe, a measured temperature of the substrate, and a thermal model of the substrate in the thermal processing system, wherein a heating of the substrate is controlled based, at least in part, on the predicted temperature profile. The control further achieves an optimized thermal uniformity across the substrate by determining one or more optimized process parameters, such as an optimum soak position of the substrate.

The method further comprises controlling the thermal uniformity and temperature of the substrate within a thermal processing system by determining an optimum soak parameter of the substrate when a pre-soak process is generally complete. For example, the substrate is moved within a vertical thermal processing furnace from a relatively low-temperature presoak position to a relatively high-temperature soak position, wherein the soak position is generally determined, based, at least in part, on one or more properties associated with the substrate just prior to moving the substrate from the presoak position to the soak position. The determination, for example, is based on an association of the one or more properties to a reference data set or a model, wherein the reference data set or model are further associated with an optimized thermal uniformity of one or more reference substrate.

According to another exemplary aspect of the invention, an offset to the predetermined move profile is ascertained, wherein the offset is further utilized to determine the soak position of the substrate in conjunction with the reference data set. For example, the measured temperature and an actual position of the substrate within the thermal processing system are utilized by the thermal model to determine the offset, wherein the offset is further utilized to determine the position of the substrate within the thermal processing system that yields a maximum thermal uniformity across the substrate. Accordingly, the present invention is an adaptive processing method that determines the soak position of the substrate temperature during processing and controls the heating of the substrate based, at least in part, on the one or more measured properties of the substrate.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
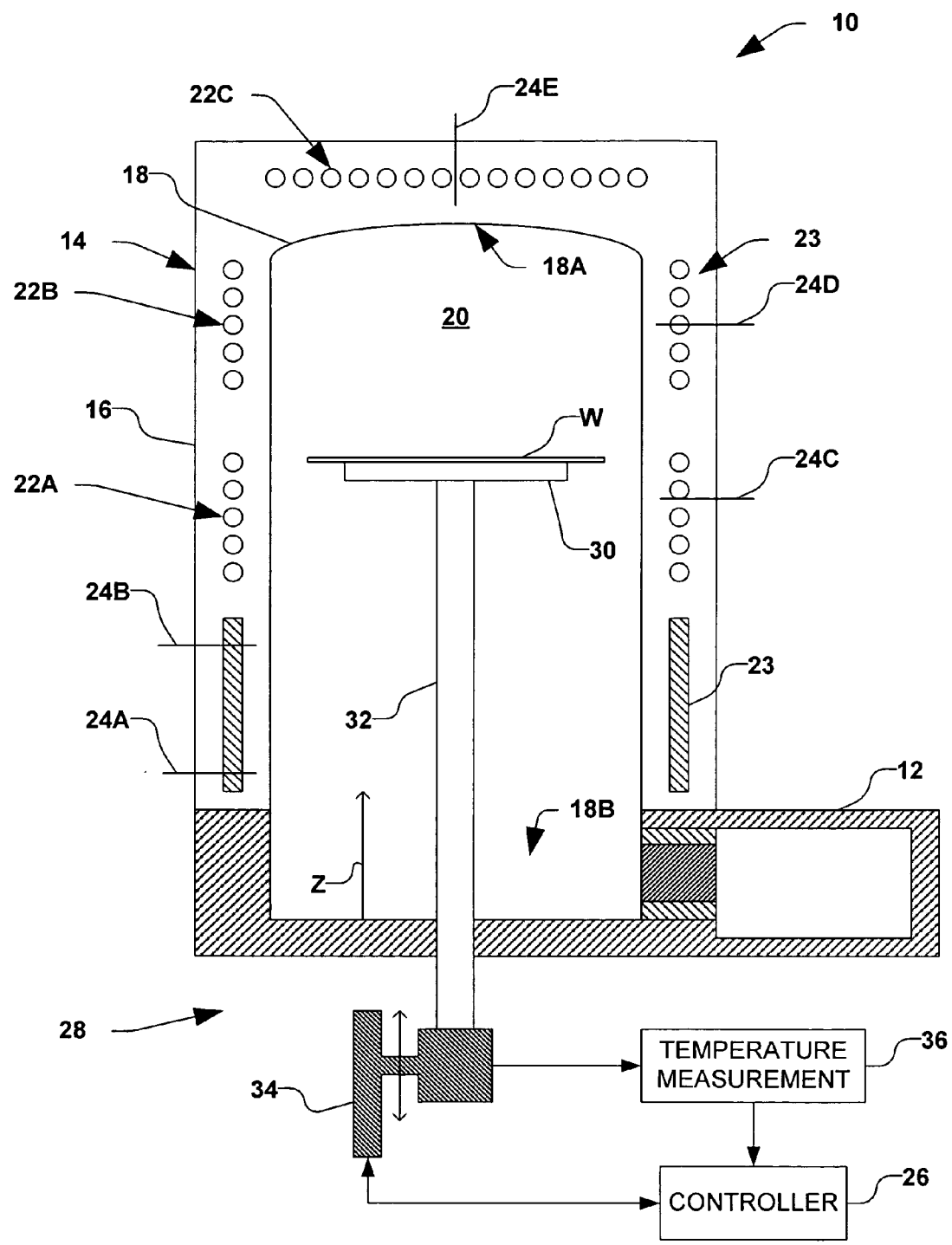
FIG. 1 is a partial cross-sectional view of an exemplary thermal processing system according to one exemplary aspect of the present invention.

The present invention is generally directed towards a method for thermally processing a workpiece or substrate. In particular, thermal uniformity across the substrate is controlled by determining one or more process parameters for optimized uniformity, wherein the determination is based, at least in part, on one or more measured properties associated with the substrate and a reference data set associated with an optimal thermal uniformity. The method further controls the one or more process parameters, such as a position of the substrate within a thermal processing system, in order to optimize the resulting thermal uniformity across the substrate. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

In accordance with one aspect of the present invention, a method for thermally processing a substrate in a thermal processing system is provided, wherein a control of the thermal process utilizes dynamic predictive thermal modeling. The processing method generates one or more optimized processing parameters based, at least in part, on one or more initial processing parameters, a given processing recipe, and one or more measured properties of the substrate, and controls a heating of the substrate in order to achieve one or more desired results, such as an optimum thermal uniformity across the substrate.

The present invention is thus an adaptive processing method to produce optimal thermal uniformity across the substrate and/or between substrates, wherein the method predicts and/or optimizes one or more processing parameters, such as a presoak temperature, presoak position, presoak time duration, soak position, soak time duration, and/or a temperature slope at presoak termination. The prediction and/or optimization, for example, is based, at least in part, on the one or more measured properties of the substrate during processing (e.g., in-situ). The method further controls the heating of the substrate, wherein the control is based, at least in part, on the predicted and/or optimized processing parameters. For example, the method comprises controlling the thermal uniformity of the substrate by controlling a maximum position associated with a maximum target temperature of the substrate within the thermal processing system during a spike anneal process.

In another example, the method utilizes empirical measurements associated with one or more reference substrates in order to form a reference data set to predict and/or optimize the thermal uniformity across the substrate. The one or more optimized processing parameters, such as the optimized soak position of the substrate, is then selected based, at least in part, on the reference data set, wherein thermal uniformity across the substrate is optimized. In another example, the prediction and/or optimization is further based on a thermal model of the thermal processing system and the substrate. Thus, the present invention is further adaptive, such that the method determines the one or more optimal processing parameters of the substrate during processing, and wherein the method further controls the heating of the substrate based, at least in part, on the actual measured properties.

Referring now to the figures, FIG. 1 illustrates an exemplary thermal processing system 10 for thermally processing a workpiece or substrate (e.g., a silicon wafer) in accordance with one exemplary aspect of the present invention. According to one example, the thermal processing system 10 comprises a wafer handling system 12 adapted to load a wafer W into, and conversely remove the wafer from, a thermal processing furnace 14. The thermal processing furnace 14, for example, comprises a main outer housing 16 that encloses a vertical furnace having a cylindrical process tube 18 that has a closed end 18A and an opposed open end 18B. The cylindrical tube 18 generally defines a heating or process chamber 20. The process tube 18, for example, can be used as a constant or continuous heat source. As used herein, the term "continuous" is intended to include continuity in terms of both temperature and heating surface area. The process tube 18, for example, can be formed of any high temperature material such as alumina, silicon carbide, and other suitable ceramic materials.

According to one example, the process tube 18 is surrounded by a three zone resistive heating module comprising three suitable heating elements 22A, 22B, and 22C. The heating elements 22A, 22B, and 22C, for example, comprise resistance-heated elements or RF heated black body cavity susceptors as a primary heat source. This particular type of heat source is generally simple to implement, is well characterized, and is widely accepted as a reliable technique for stable and uniform control of furnace temperature. According to one exemplary aspect of the invention, the heating elements 22A, 22B, and 22C form part of a vertically oriented, three zone resistive heater module 23. The heating elements 22A, 22B, and 22C, for example, can be comprised of low mass, high temperature metallic wires (not shown). Insulation (not shown) surrounding each heating element 22A, 22B, and 22C can be comprised of ceramic fibers having a high insulation value and a low thermal mass. The heating elements 22A, 22B, and 22C, for example, are further designed for a fast response to temperature changes. The heater module 23, for example, can also include an air cooling system (not shown) to help cool the processing chamber 20. A diameter of the process tube 18, and thus a size of the vertical furnace 14 can be easily scaled to accommodate wafers W of varying sizes.

According to another exemplary aspect of the invention, the thermal processing system 10 comprises any suitable thermal processing apparatus that is adapted to thermally process silicon wafers at selected temperatures. According to a preferred embodiment, the illustrated thermal processing system 10 incorporates a rapid thermal processing furnace 14 sold under the trade name of Summit XT by Axcelis Technologies, USA. The Summit XT design system is particularly advantageous as a single wafer furnace that achieves high repeatability and uniform results with relatively low maintenance requirements. The thermal processing furnace 14, for example, is operable to develop a temperature gradient by using a "hot wall" vertical processing chamber 20 for single wafer processing, as opposed to multiple lamp banks. Such a hot wall chamber 20 is developed by disposing the heater module 22 at the top (e.g., the closed end 18A) of the chamber 20 (e.g., a bell jar) and a cooling system 23 at the bottom (e.g., the open end 18B) of the chamber, thereby creating a generally smooth temperature gradient from the top of the process chamber to the bottom, wherein the top of the chamber substantially approaches a black body radiator.

With the temperature profile of the thermal processing chamber 20 generally fixed, the desired temperature is achieved, for example, by simply adjusting a position Z of the wafer W within the processing chamber. Temperature ramp up and ramp down rates of the wafer W, as well as a maximum target temperature associated with a spike anneal process, for example, can be controlled by a velocity at which the wafer is vertically moved through the temperature gradient within the chamber 20. One or more additional heating or cooling stages (not shown) can further be provided, in addition to the illustrated system 10. The selected ramp rates, velocities, and/or maximum target temperatures, for example, are generally determined by a process recipe, thus generally determining the overall heating and cooling rates of the wafer.

In accordance with one example, the illustrated thermal processing system 10 employs a series of thermocouples, such as thermocouples 24A–24E, that are distributed about the furnace 14 to measure a temperature of the furnace. The thermocouples measure temperature at selected locations for subsequent use by a controller 26. The controller 26, for example, can establish a selected thermal gradient along the process tube 18, and output signals (not shown) such as spike thermocouple temperature settings generated by the thermocouples 24A–24E can be sampled to ensure that the desired temperature gradient is maintained. The temperature measurements from the thermocouples 24A–24E can further be utilized to assist the system 10 in determining certain selected furnace set points prior to processing each wafer W. For example, before processing a wafer W, a thermal gradient along the process tube 18 is established by adjusting the heating elements 22A–22C until desired thermocouple set points are reached. Typically, the thermocouple set points are adjusted such that the top 18A of the process chamber 20 is disposed at a temperature which is higher, such as 200° C., than a desired wafer processing temperature. The heating elements 22A–22C, for example, are continuously and actively controlled through the thermocouple measurements during wafer processing in order to maintain a stable thermal environment.

According to another example, the heating elements 22A, 22B, and 22C are arranged about the process tube 18 in order to heat the processing chamber 20 to a predetermined temperature, such as between 400° C. and 1300° C. in the case of a chemical vapor deposition, or between 800° C. and 1300° C. in the case of oxidation or diffusion. The heating elements 22A–22C, for example, furthermore form an isothermal heating zone (not shown) within the processing chamber 20. The controller 26, for example, can be further utilized to regulate the temperature of the process tube 18 according to the exigencies of the processing technique. For example, according to one example, a temperature sensor (not shown), such as an optical pyrometer, is coupled to the controller 26, and can be used to sense the chamber temperature for providing a signal which can be correlated to wafer temperature.

The wafer handling system 12, for example, comprises any suitable wafer transport assembly for loading and unloading the wafer W to and from an elevator subsystem 28. An example of one type of wafer handling system is described in U.S. Pat. No. 5,820,366, the contents of which are herein incorporated by reference. The elevator subsystem 28, for example, comprises a quartz wafer holder 30 coupled to a wafer elevator tube 32. The elevator tube 32, for example, further slidingly engages a guide rod 34. According to another example, the elevator subsystem 28 further comprises a suitable servo motor (not shown) coupled to the guide rod 34 or elevator tube 32 for selectively moving the elevator vertically along the guide rod into and out of the process chamber 20, thus controlling a position Z of the wafer W within the process chamber. The servo motor (not shown), for example, is further controlled by the controller 26, wherein the controller or elevator subsystem 28 further comprises a motion controller (not shown) or encoder which is operable to determine the position Z of the wafer W within the chamber 20. The controlled position Z of the wafer W with respect to time t, for example, can be stored in a move profile Z(i) of the wafer, wherein i is associated with discrete points in time 0, 1, 2 . . . N−1, where N represents the total number of discrete points in the move profile.

The controller 26 is further operable to actuate the elevator subsystem 28, which in turn moves the wafer W in the process chamber 20 so as to generally achieve, attain, follow or match as closely as possible the intended move profile Z(i). The elevator subsystem 28 is operable to move the wafer W in the process chamber 20 in a predetermined manner so as to heat or cool the wafer in a selected manner. One or more portions of the move profile Z(i), for example, are generally determined by the controller from the process recipe, wherein the process recipe comprises, among other processing parameters, one or more of a predetermined maximum velocity $V_{max}$, maximum acceleration $A_{max}$, maximum position $Z_{max}$ of the wafer W that is associated with a desired target temperature $T_{target}$ or spike anneal temperature, and minimum position $Z_{min}$ of the wafer, and a nominal position $Z_{nominal}$ of the wafer, wherein the nominal position $Z_{nominal}$ is associated with a predetermined nominal processing position of the wafer within the thermal processing system 10 that is operable to produce nominal results. According to one example, the desired target temperature $T_{target}$ is approximately 1050° C.

According to another exemplary aspect of the present invention, the thermal processing system 10 comprises a temperature measurement system 36 for detecting, measuring and/or determining one or more actual temperatures T of the wafer W within the thermal processing chamber 20. The temperature measurement system 36, for example, comprises one or more pyrometers (not shown) for detecting one or more parameters of the wafer W at one or more locations on the wafer, such as the temperature T. For example, the one or more pyrometers (not shown) are operable to detect an amount of light emitted and reflected from the wafer W, and then to generate one or more respective signals which are sent to the controller 26. The controller 26, based upon the one or more signals from the one or more pyrometers, for example, is further operable to determine one or more emissivities and temperatures T of the wafer W. Exemplary suitable temperature measurement systems 36 are disclosed and described in U.S. Pat. No. 6,375,348, U.S. Pat. No. 6,461,036, and U.S. Pat. No. 6,183,137, and the contents of said patents are herein incorporated by reference. The one or more pyrometers (not shown) can further be utilized to directly and non-invasively measure the actual wafer temperature T associated with one or more locations on the wafer W, such as a temperature at or near the center (not shown) of the wafer.

The controller 26, for example, is operable to accumulate selected processing data associated with the thermal processing system 10, and may further comprise a user interface (not shown) for allowing selected information to be input to the system 10 or exchanged between the system and a user. The user interface can be any suitable input device, such as one or more of a keyboard, monitor, mouse, and touchscreen. The controller 26 is further operable to generally regulate the temperature gradient within the process chamber 20 of FIG. 1, and employs the thermocouples 24A–24E to ensure that the proper temperature gradient is attained.

Figure 2:
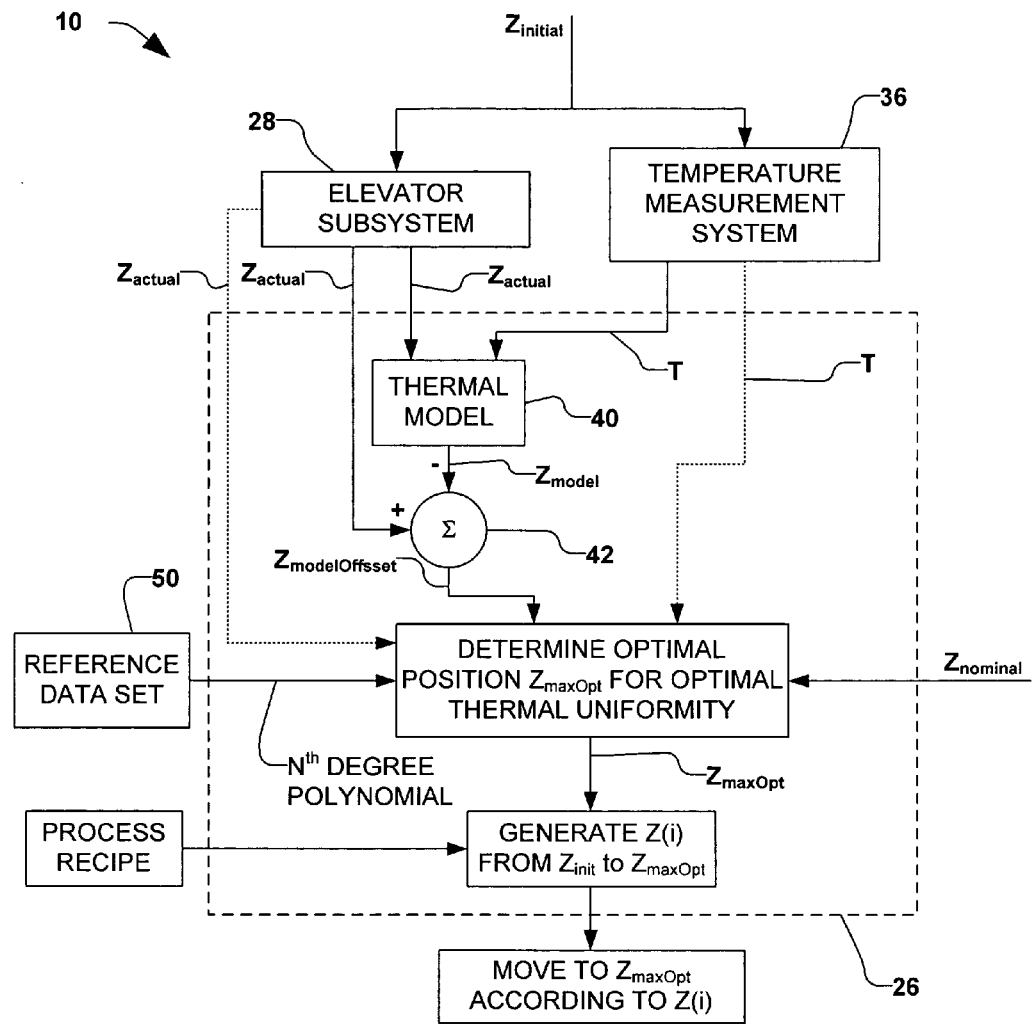
FIG. 2 is a combined functional and block diagram representing exemplary operational aspects of the wafer processing system according to another aspect of the present invention.

Referring now to FIG. 2, a combined functional and block diagram of the thermal processing system 10 is illustrated as an overview of one exemplary aspect of the present invention. As illustrated in FIG. 2, the controller 26 comprises any suitable computing apparatus, such as a computer or data processor, having suitable storage and processing elements. Preferably, the controller 26 stores a suitable temperature control program that controls the operation of the thermal processing system 10 in order to heat the wafer W according to an intended wafer temperature profile, trajectory, or target temperature of the wafer. The control program, for example, employs the actual wafer temperature T signal provided by the temperature measurement system 36, the actual wafer position $Z_{actual}$ provided by the elevator subsystem 28, a modeled wafer position offset $Z_{modelOffset}$ provided by a thermal model 40 of the thermal processing system and the substrate, and the move profile Z(i) generated by the controller 26 from the process recipe parameters to predict a temperature profile T(Z(i)) of the wafer W at varying positions Z within the process chamber 20 (e.g., from a high temperature soak position to a lower temperature post-soak position), as will be discussed infra. The thermal model 40, for example, comprises a thermal model such as that described in U.S. Pat. No. 6,610,968 and U.S. patent application Ser. No. 10/732,161, filed on Dec. 10, 2003, which are herein incorporated by reference in their entireties. It should be noted that the thermal model described in the '968 patent is only one example of a thermal model 40 of an exemplary thermal processing system, and other thermal models which are representative of various other thermal processing systems are contemplated by the inventors, and all such thermal models and thermal processing systems are understood to fall within the scope of the present invention.

In accordance with one exemplary aspect of the present invention, a total amount of incident power $W_{incident}$ on the wafer W within the process chamber 20 of FIG. 1, for example, can be expressed as a function of wafer position $Z_{wafer}$ by the function $W_{Incident}(Z_{wafer})$. In this example, the incident power $W_{Incident}$ on the wafer W can be modeled by the thermal model referenced in the '968 patent, wherein the total incident power $W_{Incident}$ of the present invention is the sum of heat source terms $q_t(z)$ and $q_b(Z)$ in equations (11) and (12) of the referenced patent. Therefore, the fraction of incident power [watts] absorbed by the wafer W can then be defined as:

$$W_{absorbed} = \epsilon(T) W_{Incident}(Z_{wafer}) \quad (1)$$

where $\epsilon(T) \equiv$ emissivity of the wafer W at given temperature T [°K]. The power emitted from the wafer W at temperatures T is defined by the Stephan-Boltzman Law:

$$W_{emitted} = 2\epsilon(T)\sigma A_{wafer} T^4 \qquad (2)$$

where $\sigma \equiv$ Stephan-Boltzman Constant [watts/m² °K⁴], and $A_{wafer} \equiv$ a surface area [m²] of one side of the wafer W.

Thus, the net power into or out of the wafer at any given time is:

$$W_{net} = W_{absorbed} - W_{emitted} \qquad (3)$$

Therefore, the net power $W_{net}$ will generate a change in temperature T associated with the wafer W. According to one exemplary aspect of the invention, a modeled rate of temperature change $T_{dotModel}$ is utilized to generate or predict the temperature profile $T(Z(i))$. $T_{dotModel}$ is further related to the net power $W_{net}$ by the thermal mass $M_{thermal}$ of the wafer W as follows:

$$T_{dotModel} = W_{net}/M_{thermal} [°K/sec] \qquad (4)$$

where $$M_{thermal} = M_{wafer} C_p(T) [watt \ sec/°K] \qquad (5)$$

and where $M_{wafer} \equiv$ a mass [kg] of the wafer W and $C_p \equiv$ a specific heat [watt sec/°K kg] of wafer W at temperature T. Hence, substituting equations (1) and (2) into (3) and equations (3) and (5) into equation (4) yields:

$$T_{dotModel}(T,Z) = [\epsilon(T)W_{Incident}(Z_{wafer}) - 2\epsilon(T)\sigma A_{wafer} T^4] / [M_{wafer} C_p(T)] \qquad (6)$$

wherein the modeled rate of temperature change $T_{dotModel}$ is described as a function of the measured temperature T and wafer position Z.

The present invention, according to another exemplary aspect, further utilizes thermal models of both the process chamber temperature gradient (e.g., in a bell jar) and the wafer in order to estimate the amount of thermal power incident to the wafer (e.g., $W_{Incident}(Z_{wafer})$), as well as the instantaneous rate of change of wafer temperature $T_{dotModel}$ as a result of the incident power. Furthermore, a modeled estimate of the time derivative of temperature at time i can be defined as $T_{dotModel}(i)$. $T_{dotModel}(i)$, for example, can be estimated as a function of wafer temperature $T(i)$ and an adjusted wafer position $Z_{adjusted}(i)$, wherein the wafer position is adjusted for a model offset, as will be discussed infra. Therefore, we can say:

$$T_{dotModel}(i) = f(T(i), Z_{adjusted}(i)). \qquad (7)$$

Given an initial temperature measurement T(0), the rate of temperature change can be used to estimate the temperature at future points in time. For example, a three iteration estimation method can be performed, wherein at the next profile point i+1, the first estimate of temperature would be:

$$T_{Est1}(i+1) = T(i) + (dt)(T_{dotModel}(i)) \qquad (8)$$

wherein dt is the time interval [sec] between profile points i and i+1. The first estimate of the modeled time derivative of temperature at profile point i+1 would then be:

$$T_{dotModel\_Est1}(i+1) = f(T_{Est1}(i+1), Z_{adjusted}(i+1)). \qquad (9)$$

Then, at profile point i+1, the second estimate of temperature would be:

$$T_{Est2}(i+1) = T(i) + (dt)(T_{dotModel}(i) + T_{dotModel\_Est1}(i+1))/2 \qquad (10)$$

and the second estimate of the modeled time derivative of temperature at profile point i+1 would be:

$$T_{dotModel\_Est2}(i+1) = f(T_{Est2}(i+1), Z_{adjusted}(i+1)). \qquad (11)$$

T(i+1) can further be considered the final value of temperature at the next profile point i+1. Thus, the next temperature at profile point i+1 would be:

$$T(i+1) = T(i) + (dt)(T_{dotModel}(i) + T_{dotModel\_Est2}(i+1))/2. \qquad (12)$$

Consequently, using T(i+1) and $Z_{adjusted}(i+1)$, each subsequent temperature T(i) can be found along the $Z_{adjusted}(i)$ move profile. The exemplary estimation technique described above generally improves an accuracy of the predicted temperature profile T(Z(i)) from the high temperature soak position to the lower-temperature post-soak position in the thermal processing system. However, it should be noted that various other estimation techniques may be utilized, and all such techniques are contemplated as falling within the scope of the present invention.

According to still another exemplary aspect of the present invention, the move profile Z(i) from the high temperature soak position to the lower-temperature post-soak position used to generate the predicted temperature profile T(Z(i)) is predetermined, and does not change from wafer to wafer. For example, the move profile Z(i) is the same move profile the motion controller will use for every wafer W processed in order to move the wafer after the desired peak temperature (e.g., the target temperature $T_{target}$) is predicted. According to another example, the actual movement of the wafer W according to the move profile Z(i) is not of particular importance, other than that a rapid monotonic move is most beneficial for achieving a high temperature ramp rate. For example, such a move profile Z(i) can be calculated apriori.

According to yet another exemplary aspect of the present invention, the thermal model 40 of FIG. 2 is utilized to calculate a theoretical or modeled position $Z_{model}$ of the wafer W from the measured temperature T and actual position $Z_{actual}$ for each pyrometer and motion controller update, respectively. The thermal power function $W_{Incident}(Z_{wafer})$ is further used to generate a mapping or lookup table (not shown) of incident power $W_{Incident}$ versus wafer position $Z_{wafer}$. The lookup table, for example, can be consequently used in reverse to find wafer position $Z_{wafer}$ for a given $W_{Incident}$. This reverse mapping function can be defined as:

$$Z_{wafer} = f(W_{Incident}). \qquad (13)$$

Using the same relation of incident, absorbed, and emitted power as described above, we can then say:

$$W_{Incident} = [2\epsilon(T)\sigma A_{wafer} T^4 + T_{dotModel} M_{wafer} C_p(T)]/\epsilon(T). \qquad (14)$$

Accordingly, substituting equation (14) into (13), we get the modeled wafer position:

$$Z_{model} = f([2\epsilon(T)\sigma A_{wafer} T^4 + T_{dotModel} M_{wafer} C_p(T)]/\epsilon(T)). \qquad (15)$$

Furthermore, according to another exemplary aspect, the above values are repeatedly calculated, such as at a sample time n, n+1, n+2, etc. For example, a sampling frequency of greater than approximately 300 Hz can be utilized by the controller 26 for temperature acquisition, thus providing a high degree of accuracy for the model. The modeled time derivative of temperature change can therefore be expressed as a function of discrete time as:

$$T_{dotModel}(n) = T_{dotModel}(T_{model}(n-1), Z(n)) \qquad (16)$$

where $T_{model}(n-1)$ the modeled temperature derived for sample n−1, and $Z(n)$=the actual position ($Z_{actual}$) of the wafer W at the present sample time n. Thus, the modeled wafer position of equation (15) can be expressed as a function of discrete time as:

$$Z_{model}(n)=f\{[2\epsilon(T(n))\sigma A_{wafer}T(n)^4+T_{dotModel}(n) M_{wafer}C_p(T(n))]/\epsilon(T(n)))\} \quad (17)$$

where $T(n)$=the measured wafer temperature at the present sample time n.

Still further, according to another exemplary aspect of the invention, an adjustment to $T_{dotModel}(n)$ of equation (16) can be made to improve the resulting accuracy. The adjustment can be described as a function of discrete time as:

$$T_{dotModelAdjusted}(n)=T_{dotModel}(T_{model}(n-1), Z(n))+ MTG^*(T(n-1)-T_{model}(n-1)) \quad (18)$$

where MTG=a Model Tracking Gain which is used to actively adjust $T_{dotModel}(n)$ of equation (16) over time. The Model Tracking Gain MTG, for example, can be a predetermined value or function, or the MTG can be actively calculated by the controller 26 to adjust the model over time. Accordingly, the predicted modeled temperature $T_{model}(n)$ can be derived by integrating $T_{dotModelAdjusted}(n)$ over time n and can be expressed as:

$$T_{model}(n)=T_{model}(n-1)+T_{dotModelAdjusted}(n)\Delta t \quad (19)$$

where $\Delta t$ is a sampling period [sec] between consecutive samples. Therefore, $T_{model}$ at time n−1 can be expressed as:

$$T_{model}(n-1)=T_{model}(n-2)+T_{dotModelAdjusted}(n-1)\Delta t. \quad (20)$$

Accordingly, substituting the adjusted modeled time derivative of temperature change $T_{dotModelAdjusted}(n)$ for $T_{dotModel}(n)$ in equation (17), the active adjustment of the model can be implemented, wherein the modeled wafer position $Z_{model}(n)$ can be consequently described as:

$$Z_{model}(n)=f\{[2\epsilon(T(n))\sigma A_{wafer}T(n)^4+T_{dotModelAdjusted}(n) M_{wafer}C_p(T(n))]/\epsilon(T(n)))\}. \quad (21)$$

According to yet another exemplary aspect of the invention, the controller 26 of FIGS. 1 and 2 generates the predicted temperature profile, wherein a peak or maximum predicted temperature $T_{max}$ is determined from the modeled wafer position $Z_{model}$. According to one example, the maximum predicted temperature $T_{max}$ is interpolated from the array of points $T(Z(i))$ from the high temperature soak position to the lower-temperature post-soak position using a standard three point quadratic interpolation. For example, if $T(i)$ is the maximum value in the predicted temperature array, then the points $T(i-1)$, $T(i)$ and $T(i+1)$ are fitted to an equation of the form $y=ax^2+bx+c$ to determine the maximum of $y(x)$. Using an interpolation to find $T_{max}$, for example, advantageously provides higher accuracy than simply using the maximum temperature in the $T(Z(i))$ array.

Figure 3:
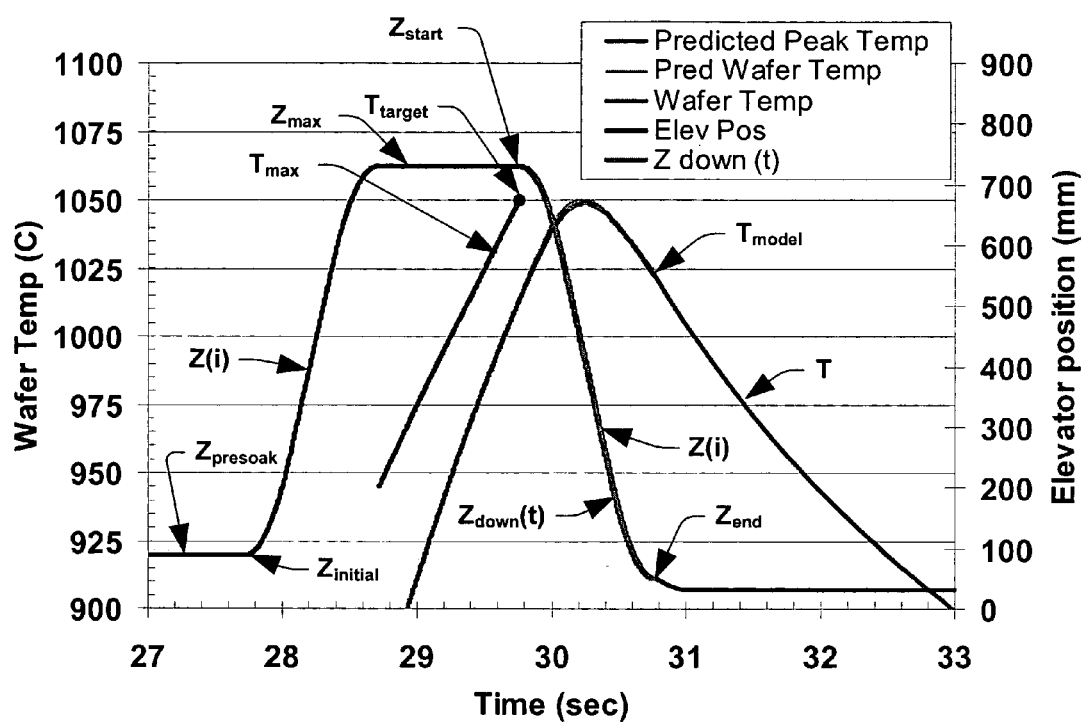
FIG. 3 is a chart of an exemplary spike anneal wafer movement and temperature profile according to one aspect of the present invention.

FIG. 3 illustrates an exemplary movement of the wafer W with respect to time in accordance with one example. Preferably, a simple trapezoidal move profile can be generated, wherein the move profile Z(i) used by the motion controller comprises moving the wafer from a presoak position $Z_{presoak}$ (e.g., associated with a presoak temperature) to a maximum position $Z_{max}$ (e.g., associated with a soak temperature) in the process chamber. According to one example, the presoak position $Z_{presoak}$ is controlled (e.g., closed-loop feedback control), wherein a substantially constant presoak temperature $T_{init}$ is maintained prior to moving to the maximum position $Z_{max}$. Therefore, an initial position $Z_{initial}$ is defined by the presoak position $Z_{presoak}$ immediately prior to the movement to the maximum position $Z_{max}$. Alternatively, the presoak position $Z_{presoak}$ is predetermined, and is substantially open-loop, wherein $Z_{presoak}$ is substantially constant, and generally equal to the initial position $Z_{inital}$.

In accordance with another example, the movement from $Z_{initial}$ to $Z_{max}$ is also predetermined, and is substantially open-loop. While at the $Z_{max}$ position, for example, the wafer is heated, and the predicted temperature profile $T(Z(i))$ is generated with each update of the pyrometer and motion controller. As discussed above, the maximum temperature $T_{max}$ is interpolated from the array of points $T(Z(i))$. When $T_{max}$ becomes greater than or equal to the target temperature $T_{target}$, the move profile Z(i) is again utilized by the motion controller to move the wafer from a start position $Z_{start}$ (e.g., the high temperature soak position) associated with $Z_{max}$ to an end position $Z_{end}$ (e.g., the lower-temperature post-soak position) in the process chamber, thus permitting the actual wafer temperature T to closely match the modeled temperature $T_{model}$. Again, the movement from $Z_{start}$ to $Z_{end}$ (e.g., referred to as $Z_{down}(t)$) is predetermined in this example, and the movement is substantially open-loop.

According to another exemplary aspect of the present invention, the thermal model 40 of FIG. 2 receives the measured wafer temperature T and wafer position $Z_{actual}$ as inputs, determines the theoretical position $Z_{model}$ of the wafer W, and the controller 26 is further operable to calculate an offset position $Z_{modelOffset}$ between the theoretical position $Z_{model}$ and the actual measured position $Z_{actual}$ of the wafer within the process chamber 20. Such a calculation of $Z_{modelOffset}$, for example, may be performed by a summer 42. The offset position $Z_{modelOffset}$, for example, is a measure of the difference between the actual wafer Z position and the model-predicted wafer Z position for a given temperature T and modeled rate of temperature change $T_{dotModel}$, wherein:

$$Z_{modelOffset}=Z_{actual}-Z_{model}. \quad (22)$$

$Z_{modelOffset}$, for example, is calculated with each update from the temperature measurement system 36 and motion control system 28. A positive value for $Z_{modelOffset}$ indicates that the thermal model would produce the actual measured temperature T at a Z position which is lower than the actual measured position $Z_{actual}$. In other words, the thermal model would produce a higher temperature T at the actual measured Z position. Likewise, the converse is true for negative values of $Z_{modelOffset}$.

Consequently, the move profile Z(i) (e.g., from $Z_{start}$ to $Z_{end}$) can be accelerated or retarded in the predicted temperature profile $T(Z(i))$ by an amount commensurate with the $Z_{modelOffset}$. The effect would be to generally shift the predicted temperature $T_{max}$ in the desired direction, wherein Z(i) would be slowed down resulting in a lower trigger temperature for runs with a positive $Z_{modelOffset}$, while Z(i) would be sped up resulting in a higher trigger temperature for runs with a negative $Z_{modelOffset}$. For example, the full value of the $Z_{modelOffset}$ correction can be used at the start of the move profile Z(i), wherein $Z_{modelOffset}$ is reduced proportionally down to zero at the $Z_{end}$. This is approximately the same as moving from $(Z_{startActual}-Z_{modelOffset})$ to $(Z_{endActual}-0)$ rather than from $(Z_{startActual}-Z_{modelOffset})$ to $(Z_{endActual}-Z_{modelOffset})$. This example of the use of the $Z_{modelOffset}$ to generate $Z_{adjusted}(i)$ can be further described by:

$$Z_{adjusted}(i)=Z(i)-Z_{modelOffset}(1-(i/N-1)) \quad (23)$$

recalling that N is the number of points in the Z(i) array, such as from $Z_{start}$ to $Z_{end}$.

Varying the speed of the modeled upward or downward move of the wafer W, for example, is an indirect way of compensating for error in the thermal model. In one example, rather than adjusting the move profile Z(i) based on $Z_{modelOffset}$, the predicted temperature profile could be run with a thermal mass constant scaled by a value that is a function of the $Z_{modelOffset}$. Furthermore, the time rate of change $Z_{modelOffsetDot}$ of $Z_{modelOffset}$ while the wafer W is waiting at the top of the bell jar may provide a better indicator of model error. For example, the magnitude of $Z_{modelOffsetDot}$ during this period is an indication of how quickly the thermal model is diverging from actual measurements, and may better reflect the difference in time constants.

Attaining the desired target temperature $T_{target}$ is important in properly thermally processing wafers W, such that desired temperatures are achieved for various thermal and/or radiative properties. However, thermal uniformities across the wafer W (e.g., intra-wafer uniformity), as well as thermal uniformities from wafer to wafer (e.g., inter-wafer uniformity) are also major concerns in properly processing wafers. For example, variations in emissive and absorbtive radiative and thermal properties across a particular wafer W can affect the overall thermal processing of the wafer for a given move profile Z(i). Thus, the variations in thermal and radiative properties translate into potential non-uniformities across the wafer W, even though the target temperature $T_{target}$ is attained as described above. Furthermore, for a given move profile Z(i) and predetermined maximum position $Z_{max}$, a plurality of wafers W can have differing thermal properties therebetween, and even though the target temperature $T_{target}$ is again attained as described above, thermal non-uniformities between the wafers can result.

The maximum position $Z_{max}$, for example, can be a predetermined position within the thermal processing system, wherein $Z_{max}$ is arbitrarily or otherwise selected, and wherein the algorithm set forth above can be utilized to reliably attain the target temperature $T_{target}$ for the predetermined $Z_{max}$. However, the maximum position $Z_{max}$ can also be controlled, in order to increase thermal uniformity across the wafer W, to stay within the thermal budgets, as well as for other processing considerations. Accordingly, the control of $Z_{max}$ will now be discussed, wherein the control is based, at least in part, on the one or more measured properties, such as temperature, associated with the wafer W during thermal processing.

In accordance with the present invention, the thermal model 40 described above and illustrated in FIG. 2 can be further utilized to control the maximum position $Z_{max}$ of the wafer W within the thermal processing system 10, wherein $Z_{max}$ can be tuned for each wafer W being processed. In turn, the control of $Z_{max}$, for example, is operable to control a thermal uniformity $U_{wafer}$ across the wafer W. The control of $Z_{max}$, for example, can be achieved via a correlation of data associated with the one or more of the measured properties, such as one or more of the temperature T, actual wafer position $Z_{actual}$, modeled wafer position $Z_{model}$, and the offset to the modeled wafer position $Z_{modelOffset}$, to reference data or another model, as will be discussed hereafter.

According to one exemplary aspect of the invention, in order to control thermal uniformity $U_{wafer}$ of the wafer W during processing, a plurality of reference wafers $W_{ref}$ having varying thermal and/or radiative properties are processed in the thermal processing system 10 in order to develop a reference data set 50. For example, the plurality of reference wafers $W_{ref}$ comprise a bare silicon substrate and other substrates having one or more thin films or layers formed thereon, wherein the reference wafers are processed utilizing a plurality of move profiles Z(i). The plurality of move profiles Z(i), for example, are further associated with a plurality of $Z_{max}$ positions. During the processing of the reference wafers $W_{ref}$, one or more properties associated with the reference wafer are recorded, such as a temperature $T_{ref}$ (e.g., a temperature of the reference wafer recorded during processing at a fixed position) and positional information $Z_{ref}$ (e.g., a position of the reference wafer recorded during processing at a fixed temperature) of the reference wafer, wherein data associated with each reference wafer, such as the offset to the modeled position $Z_{modelOffset}$ is further determined and recorded. For example, $T_{ref}$, $Z_{ref}$, and $Z_{modelOffset}$ are measured and/or determined and recorded at the predetermined intervals i, as discussed above.

After processing the plurality of reference wafers $W_{ref}$ in the thermal processing system 10, a thermal uniformity $U_{ref}$ across each reference wafer is derived from one or more characteristics associated with each processed reference wafer, such as measured sheet resistance uniformity of each reference wafer. Consequently, the reference data set 50 for the reference wafers $W_{ref}$ is operable to correlate positional information $Z_{ref}$ and other properties such as temperature information $T_{ref}$ and the offset to the modeled position $Z_{modelOffset}$ to the thermal uniformity $U_{ref}$ of each reference wafer.

Figure 4:
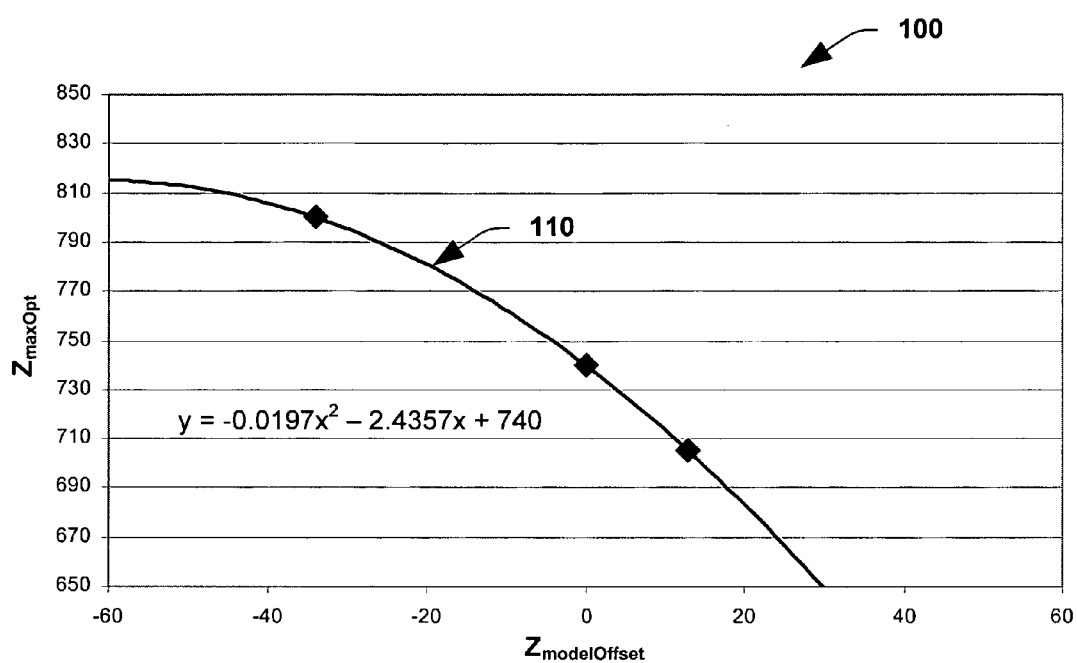
FIG. 4 is a chart of an optimized thermal uniformity curve in accordance with another exemplary aspect of the present invention.

In accordance with another example, FIG. 4 is a graph 100 illustrating an optimal thermal uniformity curve 110, wherein the curve is generally determined from the reference data set 50 of FIG. 2. For example, the optimal thermal uniformity curve 110 of FIG. 4 is empirically determined from the plurality of reference wafers $W_{ref}$, wherein the thermal uniformity $U_{ref}$ of each reference wafer is analyzed, and wherein reference wafers of varying thermal and/or radiative properties exhibiting a maximum thermal uniformity $U_{max}$ are selected to be plotted. Once the reference wafers $W_{ref}$ exhibiting maximum thermal uniformity $U_{max}$ are selected, for example, the maximum position $Z_{max}$ of each selected reference wafer $W_{ref}$ is plotted against the one or more properties associated with the reference wafer, such as $Z_{modelOffset}$, at the time associated with the reference wafer being at the initial position $Z_{initial}$. According to another example, wherein the reference wafer presoak position $Z_{refpresoak}$ utilizes closed-loop control to maintain the substantially constant presoak temperature $T_{init}$, the maximum position $Z_{max}$ of each selected reference wafer $W_{ref}$ can be plotted against $Z_{ref}$ at the time associated with the reference wafer being at the initial position $Z_{initial}$. According to still another alternative, the optimal thermal uniformity curve 110 is a function of the maximum position $Z_{max}$ and any of the one or more properties associated with the reference wafer, and all such curves are contemplated as falling within the scope of the present invention.

The optimal thermal uniformity curve 110, according to one example, is defined by fitting the plotted points described above to an $n^{th}$ order polynomial equation, such as a polynomial equation of the form $y=ax^2+bx+c$. Alternatively, an interpolation of the reference data set 50 of FIG. 2 can be utilized to find a $Z_{max}$ associated with optimum or maximum uniformity for various values of $Z_{modelOffset}$. In another alternative, the $Z_{max}$ position associated with optimum or maximum uniformity is calculated in real time via a model. In still another alternative, the optimal thermal uniformity curve 110 can be modeled, wherein one or more characteristics associated with the reference wafers $W_{ref}$ and the thermal processing system 10 of FIG. 2, such as radial temperature distributions, are used as inputs to the reference model in order to compile the reference data set 50. Accordingly, any method of forming the reference data set 50 and/or optimal thermal uniformity curve 110 of FIG. 4 is contemplated as falling within the scope of the present invention.

Once the reference data set 50 is compiled or modeled, according to another exemplary aspect of the invention, an optimized maximum position $Z_{maxOpt}$ of a wafer being processed (e.g., the wafer W as described above) can be determined based, at least in part, on the one or more measured parameters of the wafer, such as the temperature T, and position $Z_{actual}$, as described previously, and/or a predetermined nominal position $Z_{nominal}$ that is associated with the process recipe. For example, upon determining the temperature T when the wafer W is at the $Z_{initial}$ position (e.g., at the end of a presoak of the wafer at a low temperature), the modeled offset position $Z_{modelOffset}$ can be determined, as described above, wherein $Z_{modelOffset}$ can be further utilized, in conjunction with the reference data set 50 of FIG. 2 in order to determine a $Z_{maxOpt}$ position (e.g, the soak position) that will optimize thermal uniformity across the wafer. In one example, the $Z_{modelOffset}$ of the wafer W when the wafer is at the $Z_{initial}$ position can be input to the polynomial equation associated with the optimal thermal uniformity curve 110 of FIG. 4, thus determining the $Z_{maxOpt}$ position wherein thermal uniformity of the wafer is optimized. Alternatively, the $Z_{initial}$ position can be compared to the $Z_{ref}$ position at the given temperature, in order to further determine the $Z_{maxOpt}$ position wherein thermal uniformity of the wafer is optimized. In still another alternative, any of the one or more measured parameters associated with the wafer W can be utilized to determine the optimized $Z_{maxOpt}$ position, and all such alternatives are contemplated as falling within the scope of the present invention.

Figure 5:
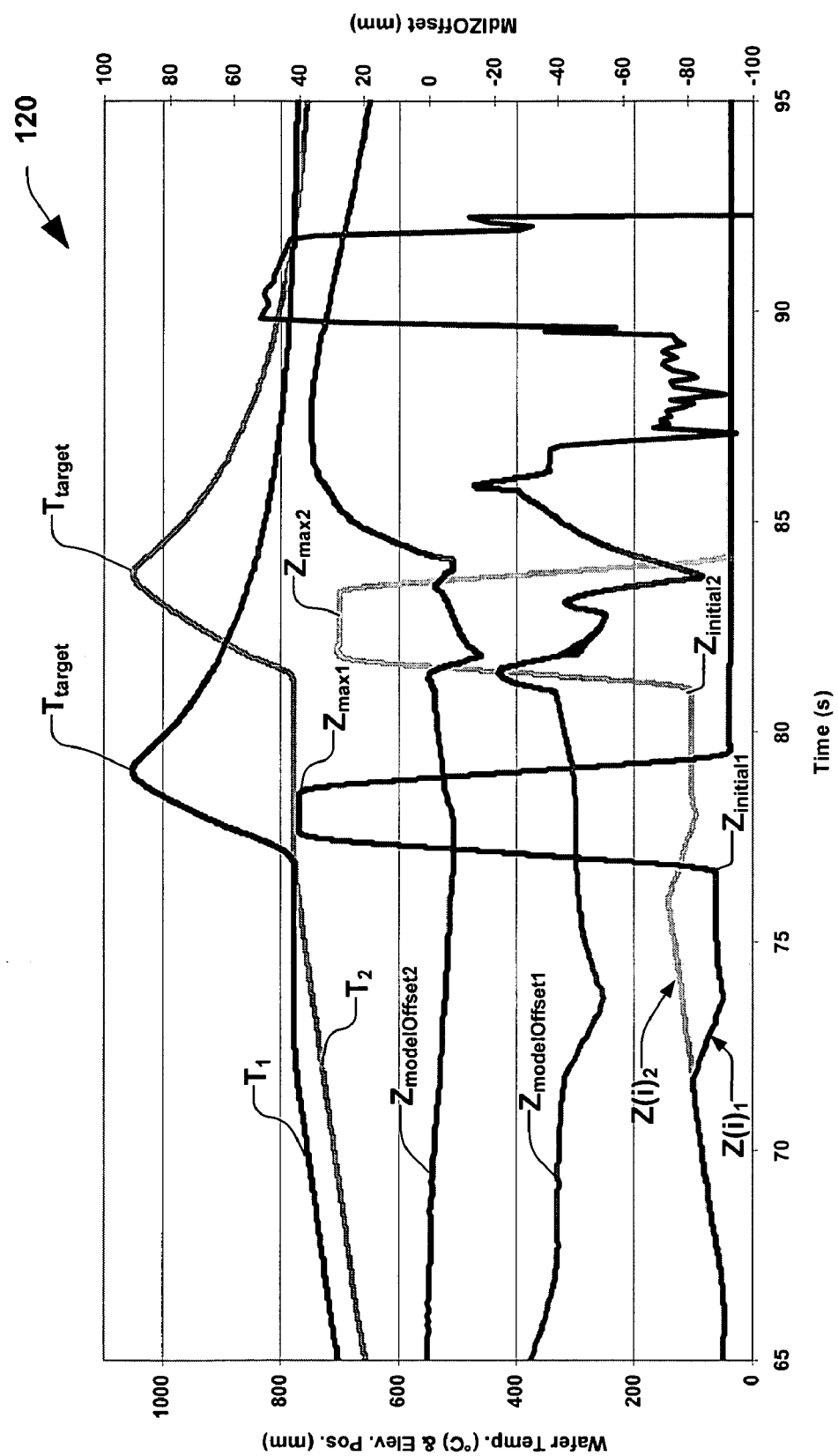
FIG. 5 is a chart of a comparison between two exemplary offsets according to another exemplary aspect of the present invention.

FIG. 5 is a graph 120 illustrating two exemplary move profiles $Z(i)_1$ and $Z(i)_2$ of two respective wafers $W_1$ and $W_2$, along with respectively associated wafer temperatures $T_1$ and $T_2$ and offsets to modeled positions $Z_{modelOffset1}$ and $Z_{modelOffset2}$, in order to more clearly illustrate one aspect of the present invention. For example, $W_1$ and $W_2$ have differing properties (e.g., differing radiative properties), and are both processed utilizing a presoak temperature of 780° C. and a target temperature $T_{target}$ of 1050° C. (e.g., soak temperature). It should be noted that the move profiles $Z(i)_1$ and $Z(i)_2$ are offset in time for purposes of clarity.

As can be seen from the graph 120, both move profiles $Z(i)_1$ and $Z(i)_2$ move the elevator in order to maintain the constant presoak temperature (780° C.) prior to moving up to $Z_{max1}$ and $Z_{max2}$, as described previously, however the position of the elevator at $Z_{initial1}$ and $Z_{initial2}$ is different for the two wafers. This difference is due, at least in part, to differences in thermal and/or radiative properties of the two wafers. Consequently, $Z_{modelOffset1}$ and $Z_{modelOffset2}$ are different for the two wafers, and such a difference thus leads to differing $Z_{max1}$ and $Z_{max2}$ positions when optimized for thermal uniformity, as described above. Thus, it can be seen that $Z_{modelOffset}$ drives $Z_{max}$, when optimizing thermal uniformity of wafers W.

Figure 6:
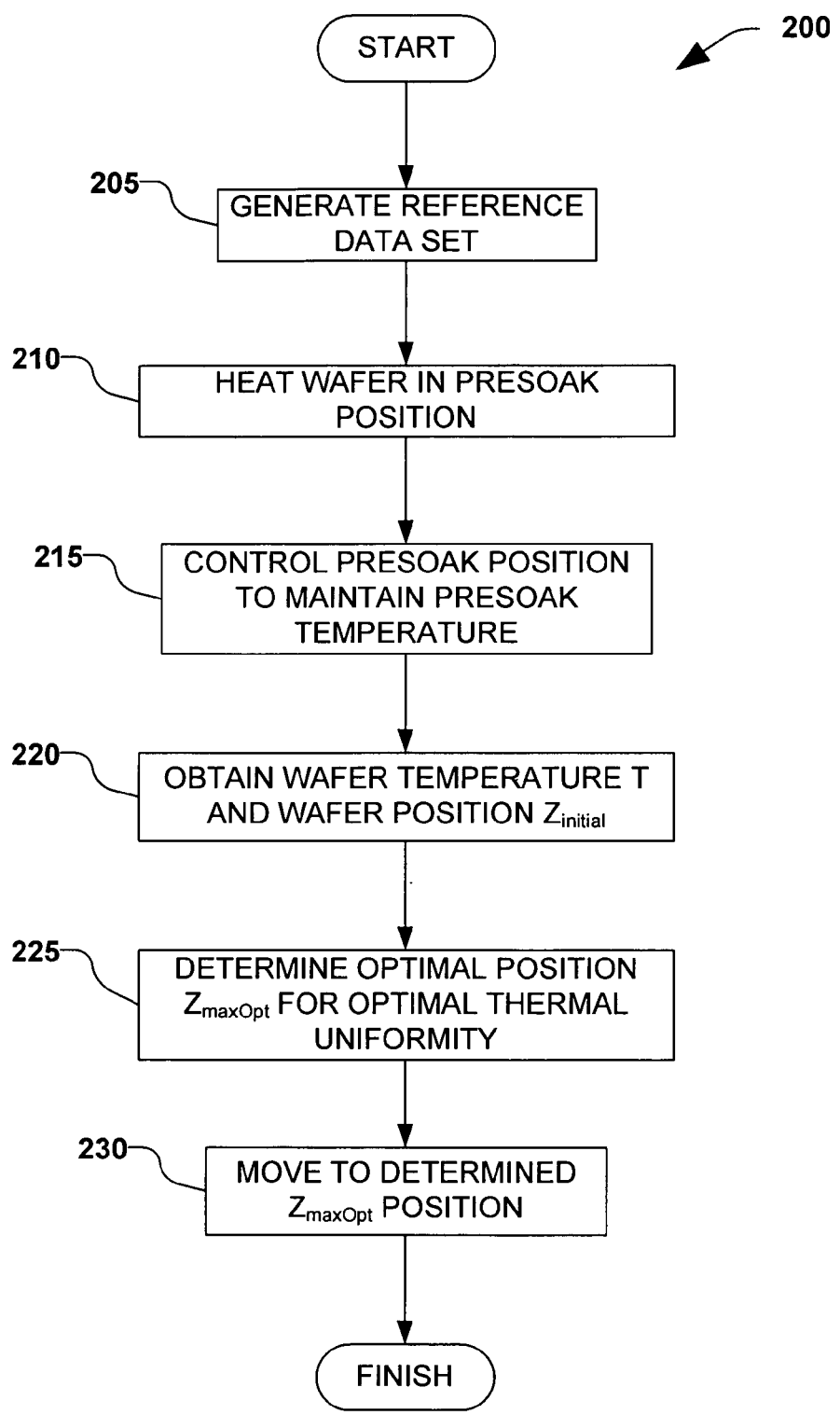
FIG. 6 is a flow chart diagram illustrating an exemplary methodology for thermally processing a substrate according to the present invention.

According to still another exemplary aspect of the present invention, FIG. 6 is a schematic block diagram of an exemplary method 200 illustrating the integration and operation of the exemplary thermal processing system 10 of FIGS. 1 and 2. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 6, the method 200 begins with act 205, wherein a reference data set is generated. Such a data set, for example, can be generated from processing a plurality of reference wafers of varying thermal and/or radiative properties in the thermal processing system, and storing measurements associated with the processing of said reference wafers. In act 210, a wafer is heated in a presoak position (e.g., a first position) in the thermal processing system, according to a predetermined processing recipe, wherein the process recipe comprises a target temperature profile, comprising a plurality of target temperatures to be achieved at varying times during processing. According to one example, the presoak position is controlled in act 215 in order to maintain a desired presoak temperature, such as by closed-loop feedback.

In act 220, one or more properties of the wafer, such as a wafer temperature T and initial wafer position $Z_{initial}$ are obtained, wherein $Z_{initial}$ is generally associated with an finish of wafer processing at the presoak temperature. In act 225, soak position (e.g., a second position) of the wafer is determined, wherein the soak position is associated with an optimal thermal uniformity of the wafer. For example, the one or more measured properties of the wafer are associated with an optimized maximum wafer position $Z_{maxOpt}$ within the thermal processing system, wherein $Z_{max}$ is generally determined in association with the reference data set. For example, $Z_{maxOpt}$ is determined by an modeled offset $Z_{modelOffset}$ that is fed into a polynomial equation associated with the reference data set. In act 230, the wafer is consequently moved to the determined $Z_{maxOpt}$ position, wherein such a $Z_{max}$ position generally provides an optimized thermal uniformity across the wafer.

It should be noted that a significant advantage of the present invention is that the control scheme can be utilized to tune the thermal uniformity of the substrate being processed in-situ, wherein the thermal uniformity is optimized based on the one or more measured properties of the wafer. Furthermore, the present invention can be advantageously practiced in a wide variety of thermal processes, and is not limited to spike anneal thermal processes. For example, the present method can be utilized in a soak anneal process, wherein a peak temperature is maintained for a predetermined period of time. Accordingly, the presoak position $Z_{initial}$, a duration of the presoak, a move from $Z_{initial}$ to $Z_{max}$ initiated by a temperature slope, and the temperature of the substrate at $Z_{initial}$ can all be similarly utilized to optimize the thermal uniformity of the substrate in-situ utilizing the method of the present invention.

It should be further noted that another significant advantage of the present invention is that the control scheme can be utilized in other process chambers which regulate the amount of heat provided to the wafer in various ways other than by an elevator mechanism. For example, in a lamp-based system, the control scheme can be modified to regulate the power or application of power to an array of one or more lamps based on the optimized thermal uniformity, wherein instead of varying a position of the wafer, an amount of power to the one or more lamps is varied in accordance with the determined optimum thermal uniformity of the substrate. Furthermore, it shall be understood that the present invention can be adapted to suit various other thermal processing systems, such as non-lamp based systems (e.g., laser-sourced thermal processing systems, etc.) and all such variations are contemplated as falling within the scope of the present invention.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method for thermally processing a substrate in a thermal processing system, the method comprising:
    providing a reference data set associated with a thermal uniformity of a plurality of reference substrates;
    providing the substrate at a presoak position associated with a presoak temperature within the thermal processing system;
    obtaining one or more properties associated with the substrate at the pre-soak position; and
    determining a soak position associated with a soak temperature of the substrate within the thermal processing system, wherein the determination of the soak position is based, at least in part, on the one or more obtained properties and the reference data set.

2. The method of claim 1, wherein the one or more properties comprise one or more of a temperature, emissivity, absorbitivity, and position of the substrate within the thermal processing system.

3. The method of claim 1, wherein an amount of heat provided to the substrate is generally determined by the position of the substrate within the thermal processing system.

4. The method of claim 3, wherein the thermal processing system comprises a vertical furnace.

5. The method of claim 1, wherein the reference data set comprises position profiles, temperatures, and empirical thermal uniformity measurements associated with the plurality of reference substrates.

6. The method of claim 5, wherein the determination of the soak position comprises a correlation between the one or more obtained properties and the reference data set.

7. The method of claim 1, wherein the plurality of reference substrates comprise a plurality of substrates having one or more of differing thermal properties and differing radiative properties respectively associated therewith.

8. The method of claim 1, wherein the determination of the soak position is further based on a mathematical expression utilizing the one or more properties associated with the substrate and the reference data set.

9. The method of claim 8, wherein the mathematical expression solves for the soak position via an $n^{th}$-order polynomial equation, wherein coefficients of the polynomial equation are based on empirical thermal uniformity measurements from the plurality of reference substrates, and wherein a variable of the polynomial equation is associated with the one or more properties associated with the substrate.

10. The method of claim 9, wherein the empirical thermal uniformity measurements comprise a measurement of sheet resistance across a surface of each of the plurality of reference substrates.

11. The method of claim 8, wherein the variable of the polynomial equation is associated with a difference between the one or more properties associated with the substrate and one or more respective properties associated the reference substrates.

12. The method of claim 1, further comprising generating a theoretical position of the substrate based on the one or more properties, wherein the theoretical position is further based on a position of the substrate and a thermal model of one or more of the thermal processing system and the substrate, and where the determination of the soak position is further based on a difference between the position of the substrate and the theoretical position of the substrate.

13. The method of claim 1, wherein the reference data set comprises a model.

14. The method of claim 1, wherein the one or more properties are obtained the end of a predetermined pre-soak time.

15. The method of claim 1, further comprising moving the substrate to the soak position.

16. The method of claim 1, wherein the presoak position is variable, the method further comprising moving the substrate in a closed-loop feedback to maintain the presoak temperature.

* * * * *